(12) United States Patent
Feder et al.

(10) Patent No.: US 9,547,229 B2
(45) Date of Patent: Jan. 17, 2017

(54) INDEX MATCHED GRATING INSCRIPTION

(71) Applicant: OFS Fitel, LLC, Norcross, GA (US)

(72) Inventors: Kenneth S Feder, Murray Hill, NJ (US); Paul S Westbrook, Bridgewater, NJ (US)

(73) Assignee: OFS FITEL, LLC, Norcross, GA (US)

( * ) Notice: Subject to any disclaimer, the term of this patent is extended or adjusted under 35 U.S.C. 154(b) by 114 days.

(21) Appl. No.: 14/185,564

(22) Filed: Feb. 20, 2014

(65) Prior Publication Data

US 2014/0232997 A1    Aug. 21, 2014

Related U.S. Application Data

(60) Provisional application No. 61/767,270, filed on Feb. 21, 2013.

(51) Int. Cl.
*G02B 6/34* (2006.01)
*G03F 1/00* (2012.01)
*G03F 7/00* (2006.01)
*G02B 6/02* (2006.01)

(52) U.S. Cl.
CPC ............. *G03F 1/00* (2013.01); *G02B 6/02138* (2013.01); *G03F 7/0005* (2013.01)

(58) Field of Classification Search
None
See application file for complete search history.

(56) References Cited

U.S. PATENT DOCUMENTS

| | | | | |
|---|---|---|---|---|
| 3,689,264 A | * | 9/1972 | Chandross | G02B 6/02114 385/129 |
| 4,627,933 A | * | 12/1986 | Eidenschink | C07C 5/03 252/299.5 |
| 5,536,604 A | * | 7/1996 | Ito | G03F 1/32 430/321 |
| 5,881,188 A | * | 3/1999 | Starodubov | G02B 6/02138 359/566 |
| 7,565,084 B1 | * | 7/2009 | Wach | H04J 14/04 398/183 |

OTHER PUBLICATIONS

JP 11-006924, Komoto et al. (translation).*

* cited by examiner

*Primary Examiner* — Uyen Chau N Le
*Assistant Examiner* — Chad Smith
(74) *Attorney, Agent, or Firm* — Sam S. Han, Esq.

(57) ABSTRACT

The disclosed embodiments provide systems and methods for mitigating lensing and scattering as an optical fiber is being inscribed with a grating. The disclosed systems and methods mitigate the lensing phenomenon by surrounding an optical fiber with an index-matching material that is held in a vessel with a sealed phase mask. The sealed phase mask allows it to be in contact with a liquid index-matching material without having the liquid index-matching material seep into the grooves of the sealed phase mask. Thus, for some embodiments, the sealed phase mask may be immersed in a liquid index-matching material without adversely affecting the function of the phase mask.

3 Claims, 11 Drawing Sheets

Top view

Side view

Top view

Side view

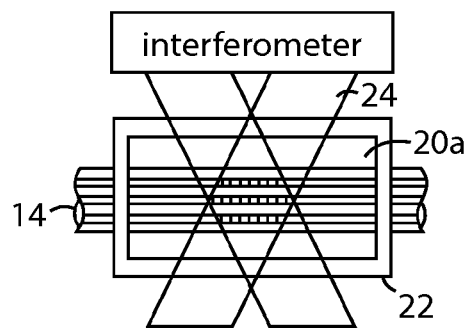
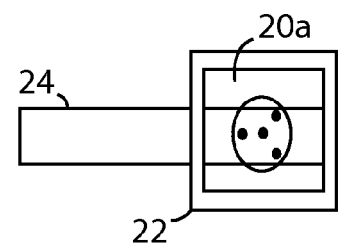
FIG. 3A　　　　　　　　　　　FIG. 3B
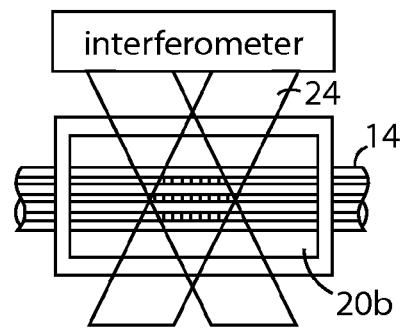
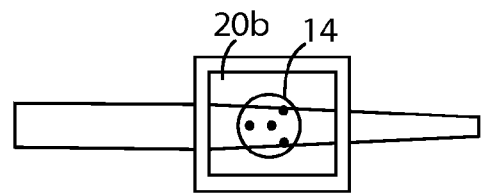
FIG. 4A　　　　　　　　　　　FIG. 4B

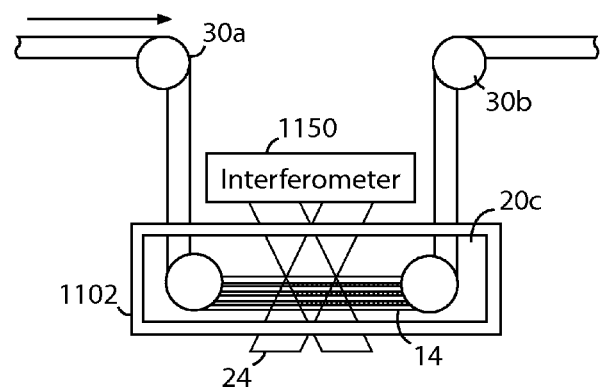
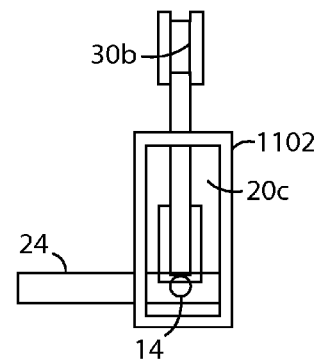
FIG. 11A
FIG. 11B
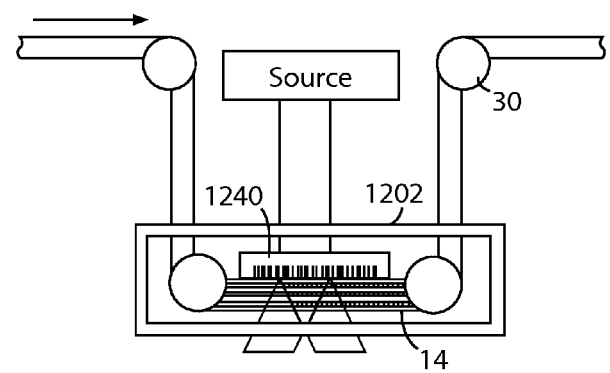
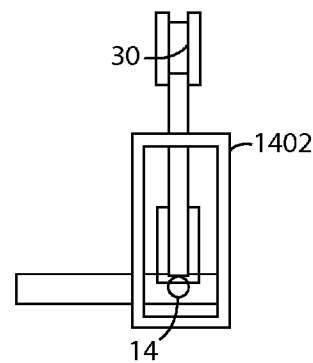
FIG. 12A
FIG. 12B

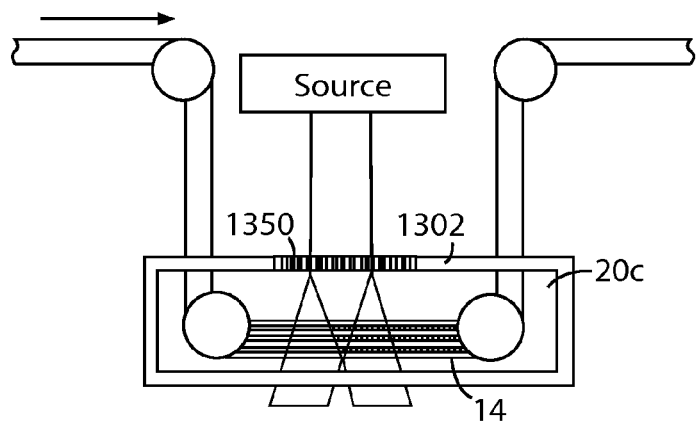
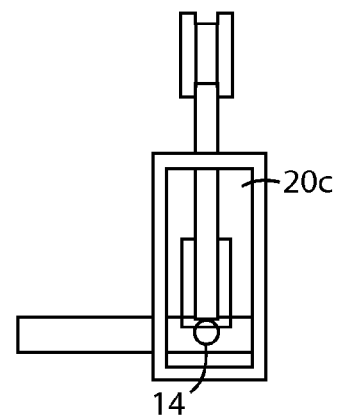
FIG. 13A　　　　　　　　　　　　FIG. 13B
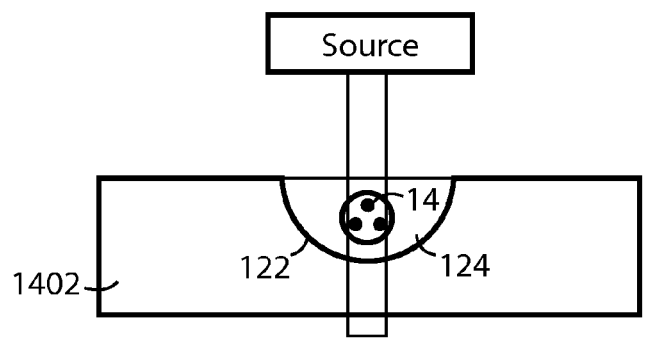
FIG. 14

INDEX MATCHED GRATING INSCRIPTION

CROSS REFERENCE TO RELATED APPLICATIONS

This application claims the benefit of U.S. provisional patent application Ser. No. 61/767,270, filed on 2013 Feb. 21, having the title "Index Matched Grating Inscription," which is incorporated by reference in its entirety as if expressly set forth herein.

BACKGROUND

Field of the Disclosure

The present disclosure relates generally to optical fibers and, more particularly, to optical fiber gratings inscription.

Description of Related Art

In optical fibers, gratings are often inscribed by exposing photosensitive regions of an optical fiber, such as the core, to actinic radiation, such as ultraviolet (UV) light. Specifically, an interference pattern is generated from the actinic radiation by, for example, using an interferogram or other known technique.

Due to the cylindrical shape of the optical fiber, when UV light irradiates the optical fiber from a direction that is transverse to the cylindrical axis, the curvature of the optical fiber causes focusing of the UV light. This phenomenon, known as lensing, results in undesirable intensity variations within the optical fiber.

Given this drawback, there is room for improvement for gratings inscription techniques.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 3A and 3B are schematic diagrams showing one embodiment of a system that mitigates the lensing phenomenon.

FIGS. 4A and 4B are schematic diagrams showing another embodiment of a system that mitigates the lensing phenomenon.

FIGS. 11A and 11B are schematic diagrams showing one embodiment of a pulley-based system with index-matching material.

FIGS. 12A and 12B are schematic diagrams showing another embodiment of a pulley-based system with index-matching material.

FIGS. 13A and 13B are schematic diagrams showing yet another embodiment of a pulley-based system with index-matching material.

FIG. 14 is a schematic diagram showing one embodiment of a vessel with index-matching material situated within a groove.

DETAILED DESCRIPTION OF THE EMBODIMENTS

Figure 1A:
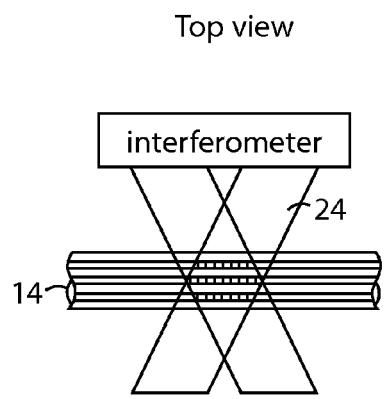
FIGS. 1A and 1B are schematic diagrams showing a lensing phenomenon.
Figure 1B:
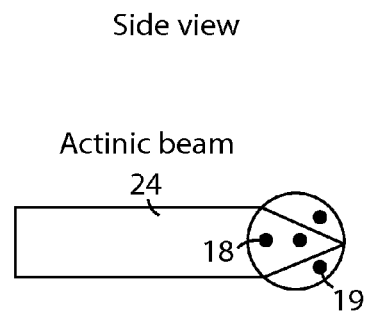

Gratings are often inscribed onto an optical fiber by exposing photosensitive regions of the optical fiber, such as the core, to an interference pattern of actinic radiation (e.g., ultraviolet (UV) light). As shown in FIG. 1B, the optical fiber is often cylindrical in shape. Thus, when an actinic beam irradiates the optical fiber from a direction that is transverse to the cylindrical axis, such as that shown in FIGS. 1A and 1B, the curvature of the optical fiber causes focusing of the UV light, as shown in FIG. 1B. This phenomenon, known as lensing, results in undesirable intensity variations within the optical fiber. For example, as shown in FIG. 1B, when an actinic beam 24 irradiates a multi-core fiber 14, depending on the configuration of the cores within the multi-core fiber 14, the actinic beam 24 may irradiate some cores 18 but wholly avoid other cores 19 due to the lensing effect. As one can appreciate, lensing can be even more complicated in fibers that do not have a circular cross section.

Figure 2A:
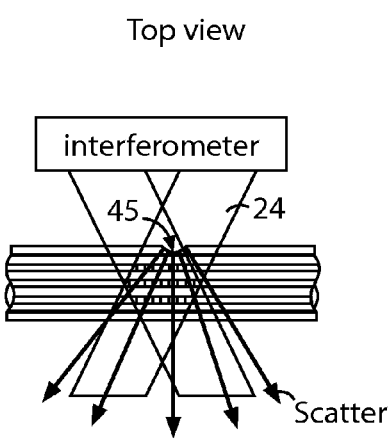
FIGS. 2A and 2B are schematic diagrams showing scattering effects caused by a defect on the surface of an optical fiber.
Figure 2B:
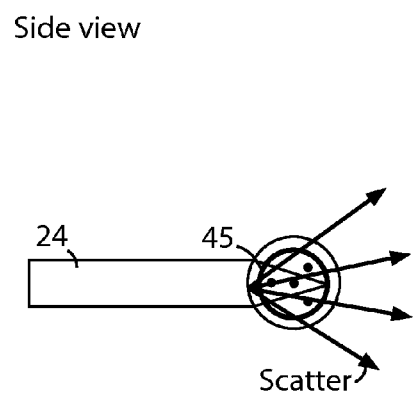

The drawbacks associated with the lensing phenomenon are exacerbated when the optical fiber 14 has a surface defect 45, such as that shown in FIGS. 2A and 2B. As shown in FIGS. 2A and 2B, the surface defect 45 causes the actinic beam 24 to scatter at the point of defect 45, thereby causing additional imperfections during the inscription process.

Applications that are sensitive to lensing and scattering include: (a) gratings with tilted planes, where the grating planes become distorted by the lensing, so that the planes are no longer straight; (b) fibers with non-uniform surfaces, where non-uniformities include intentional diameter variations, frosting of the fiber surface through chemical etching, non-circular fibers, and coatings with imperfections; (c) fibers with internal microstructures, where microstructures exacerbate the lensing effect; (d) twisted fibers with offset cores, where inherent variations exists in inscription strength due to the variation in position of one or more offset cores; (e) tapered fibers that often have abrupt decreases in outer diameter; (f) fibers with large cores (e.g., multimode or higher-order mode (HOM) fibers), where asymmetric grating profiles can exist; and (g) multi-core fibers, both untwisted and twisted along their axes; and (h) a host of other lensing-sensitive scenarios. In such applications, the actinic beam is distorted by the non-uniformities, microstructures, or other fiber properties. This distortion results in imperfect gratings and, in some cases, no gratings at all. Thus, as one can appreciate, mitigation of lensing and scattering can vastly improve the inscription process.

Lai, et al., in "Micro-channels in conventional single-mode fibers," Opt. Lett. 31, 2559-2561 (2006) ("Lai"), discloses tightly-focused beams that are directed at fibers that are immersed in oil. While the Lai scheme is appropriate for inscription techniques that rely on non-linear processes at a tight focus, the Lai scheme is not appropriate for inscription schemes that use interferograms. In particular, the Lai scheme is inappropriate for inscription schemes that: (a) employ linear, highly-photosensitive media; (b) use phase masks; or (c) are intended to write very long gratings (e.g., greater than 1000 periods), especially for gratings that are so long that the fiber is translated with respect to the interferogram by, for example, a reel-to-reel fiber-grating inscription system. Also, to the extent that the femtosecond laser pulses of Lai inscribe index changes in silica when the focus is tight, the Lai inscription process: (a) must be point-by-point; (b) is slow; and (c) requires scanning of the writing laser, thereby limiting the length of the grating. In other words, the Lai technique does not allow for significant translation of the fiber during the inscription process and, in particular, does not allow for very long displacements of the fiber (e.g., displacements more than ten (10) centimeters (cm)). Furthermore, any stray light that arises from the many reflections that come from the index-matching apparatus of Lai will have little effect on the refractive index in Lai due to their low intensities. Conversely, techniques that use interferograms and highly-photosensitive media, such as those shown in FIGS. 3A through 16, typically require management or elimination of stray light in order to reduce improper exposure. As such, the embodiments shown in FIGS. 3A through 16 permit inscription of gratings that are simply unachievable by the Lai technique.

Putnam, et al., in "Method and apparatus for forming a Bragg grating with high intensity light," U.S. Pat. No. 6,249,624 ("Putnam") discloses a grating inscription approach that avoids ablations to the surface of an optical fiber with the use of dual high-intensity beams. Specifically, Putnam teaches inscription without the use of a phase mask, relying on interference patterns that are created at the intersection of two high-intensity beams. To the extent that surface-ablation problems arise only in the context of high-intensity beams, integrating a phase mask (or any other type of interferometer) into Putnam's index-matching interface medium would defeat the principle of operation for Putnam's dual-high-intensity-beam configuration. In other words, one skilled in the art will normally avoid integrating a phase mask with Putnam's dual-beam interferometer. This is because a phase mask that produces the same interference pattern as the dual-beam would nullify the interference pattern created by Putnam's dual-beam configuration. Alternatively, if one uses a phase mask that creates a different interference pattern than Putnam's dual-beam configuration, then the resulting interference pattern would be a complex convolution of the dual-beam interference and the phase-mask interference. As such, one employing Putnam's dual-beam configuration would not use a phase mask.

Unlike Lai or Putnam, the disclosed embodiments provide systems and methods for mitigating lensing and scattering by surrounding an optical fiber with an index-matching material, where the disclosed configurations permit the use of masks or interferometers that are integrated into vessels that hold the index-matching material. In other words, unlike Putnam, where the interference pattern is generated external to the vessel, the disclosed interferometers are integrated within the vessel itself.

Also unlike Lai and Putnam the disclosed embodiments allow for long lengths of fiber to be pulled through the index-matching material without any detriment from degradation or depletion of the index-matching material as the inscription process unfolds. Furthermore, the embodiments shown herein reduce the possibility of introducing imperfections into the fiber and/or its coating as the fiber is pulled into the index-matching material or after the fiber exits the index-matching material.

The breadth of the inventive concept can only be appreciated with a proper understanding of refractive index principles. Specifically, the lensing phenomenon occurs because light refracts at the interface of two media when the two media have different indices of refraction. This is because light propagates through different media at different speeds, and the speed of propagation is dependent on each medium's index of refraction. Thus, given the curvature of the fiber and the difference in refractive indices between the air and the fiber, the actinic beam that irradiates a fiber will refract at the air-fiber interface, thereby resulting in the lensing phenomenon.

Also, the degree of refraction is dependent on the degree of difference between the refractive indices of the two interfacing media. Thus, if the indices are substantially different, then the degree of refraction is greater. Conversely, if the indices are substantially similar, then there is less refraction. As such, to the extent that the refractive indices of two interfacing materials can be perfectly matched, refraction can be wholly eliminated.

The phrase "index-matching material" can mean something different based on context. In other words, index-matching materials may differ based on a desired tolerance for refraction in a particular application. For example, for applications that require absolutely no refraction, index-matching materials will be those that have precisely the same index of refraction. Conversely, for applications that can tolerate some degree of refraction, the index-matching materials will simply be those that reduce the refraction below that tolerance level. It is also possible for the fiber to have a coating whose index is not the same as the fiber cladding or core. In this case the index-matching material may be matching to for example, the coating, the cladding, the average of the two, or some other desired combination of these indices. In general the refractive index of the index-matching material should be set so that the intensity variation inside the fiber is less than it would be if the fiber were surrounded by air. When this is the case we refer to the material as an index-matching material or as substantially index matched or simply index matched to the fiber. Examples of different index-matching materials are provided below with reference to FIGS. 3A through 16. Suffice it to say that one having skill in the art will appreciate the degree of tolerance needed for a particular application. As such, this disclosure expressly defines "index-matching material" to be one that reduces an index difference to the extent necessary for its corresponding application.

With this understanding of refractive indices, the disclosed systems and methods mitigate the lensing phenomenon by surrounding an optical fiber with an index-matching material. The index-matching material has a refractive index that is sufficient to reduce intensity variations in the actinic radiation within the optical fiber. Depending on the acceptable tolerance, the reduction in intensity variations may range from nominal to substantial. The index-matching material is held in a vessel with an integrated interferometer. The vessels can be configured in any manner, so long as the vessels permit the optical fiber to be surrounded by the index-matching material while the gratings are being written to the optical fiber and have a mask (e.g., phase mask, amplitude mask, etc.) integrated into the vessel itself.

Turning from this coarse description, reference is now made to FIGS. 3A through 16, which provide a finer description of various embodiments for mitigating lensing and scattering. It should be appreciated that, while several embodiments are described in connection with these drawings, there is no intent to limit the disclosure to the embodiment or embodiments disclosed herein. On the contrary, the intent is to cover all alternatives, modifications, and equivalents.

FIGS. 3A and 3B are schematic diagrams showing one embodiment of a system that mitigates the lensing phenomenon. Specifically, FIG. 3A shows a side view of a vessel 22 holding an index-matching material 20a, while FIG. 3B shows a cross-sectional view of the vessel 22. For clarity, the direction of the actinic beam is different between FIG. 3A and FIG. 3B. However, it should be appreciated that the actinic beam can be introduced at any angle that is non-parallel to the direction of the fiber.

As shown in FIG. 3A, the vessel 22 that holds the index-matching material 20a comprises a passage for an optical fiber 14, which is shown here as a multi-core fiber 14. This passage permits the optical fiber 14 to be surrounded by the index-matching material 20a when the optical fiber 14 is situated in the passage. Therefore, any actinic radiation 24 that passes through the optical fiber 14 necessarily passes through the index-matching material 20a. To the extent that the index-matching material 20a has the same index of refraction as the optical fiber 14, the actinic radiation 24 experiences no refraction at the boundary of the optical fiber 14 and the index-matching material 20a. For the multi-core fiber 14 of FIG. 3B, the index-matching material 20a causes the actinic radiation 24 to pass through the cross-section of the multi-core fiber 14 without lensing, thereby uniformly irradiating all of the cores within the multi-core fiber 14.

FIGS. 4A and 4B are schematic diagrams showing another embodiment of a system that mitigates the lensing phenomenon. Unlike FIGS. 3A and 3B, which show an index-matching material 20a that precisely matches the index of the optical fiber 14 and therefore eliminates refraction at the boundary, the embodiments of FIGS. 4A and 4B show an index-matching material 20b that substantially matches the refractive index of the optical fiber 14, thereby only reducing refraction at the boundary, rather than wholly eliminating the refraction. Thus, in the embodiment of FIGS. 4A and 4B, the cores do not experience uniform irradiation. However, unlike the fiber of FIGS. 1A and 1B, where several cores 19 wholly avoid irradiation due to lensing, the cores in FIG. 4B are irradiated by the actinic beam 24 due to the reduced difference in the refractive indices. As one can appreciate, if the goal is to simply irradiate all of the cores, then the index-matching material need not perfectly match the refractive index of the optical fiber, with only a sufficient reduction in refraction being needed to accomplish the irradiation of all of the cores.

Figure 5A:
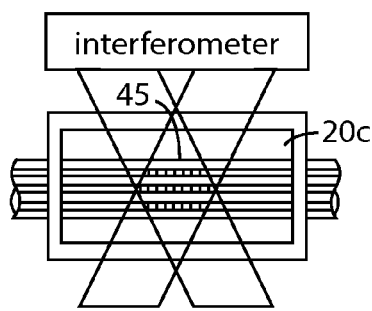
FIGS. 5A and 5B are schematic diagrams showing one embodiment of a system that mitigates the scattering caused by surface defects.
Figure 5B:
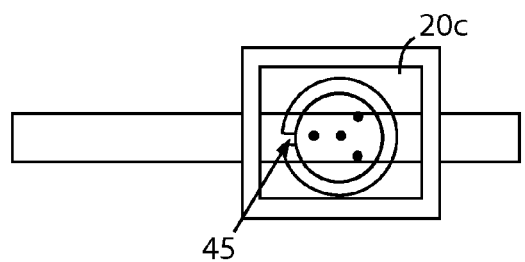

FIGS. 5A and 5B are schematic diagrams showing one embodiment of a system that mitigates the scattering caused by surface defects 45, such as those shown in FIGS. 2A and 2B. In the embodiment of FIGS. 5A and 5B, the index-matching material 20c is a liquid, such as water, oil, or other suitable liquid that has a refractive index that substantially matches the index of the optical fiber or the coating of the fiber if it has a coating. As such, when the optical fiber is surrounded by the liquid index-matching material 20c, the liquid index-matching material 20c fills the surface defect, thereby ameliorating the scattering that may be caused by the defect 45. The degree of scatter mitigation is dependent on the degree to which the refractive indices match. Thus, a precise match in the refractive indices can result in elimination of scatter due to surface defects, while a substantial match results in reduction of scatter.

Figure 6A:
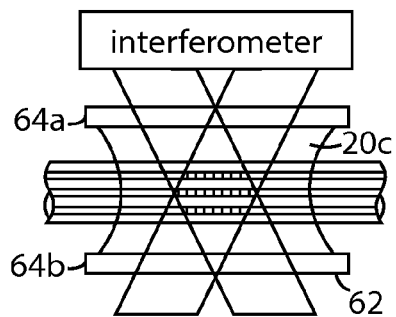
FIGS. 6A and 6B are schematic diagrams showing one embodiment of a system with index-matching material.
Figure 6B:
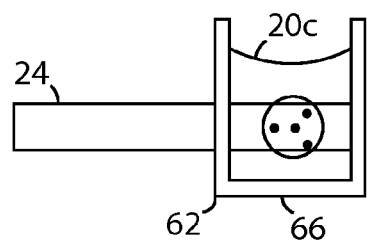

FIGS. 6A and 6B are schematic diagrams showing one embodiment of a system where a vessel 62 holds a liquid index-matching material 20c within the vessel 62 via capillary action. Specifically, FIG. 6A shows a side view, while FIG. 6B shows a cross-sectional view. As shown in FIG. 6A, the vessel 62 comprises a front plate 64a and a back plate 64b, which for some embodiments are quartz plates. The two plates 64a, 64b (collectively, 64) are separated by a gap that is sufficiently small to allow the liquid index-matching material 20c to be maintained within the gap via capillary forces. As shown in FIG. 6B, the gap between the two plates 64 is maintained by a spacer 66.

Figure 7:
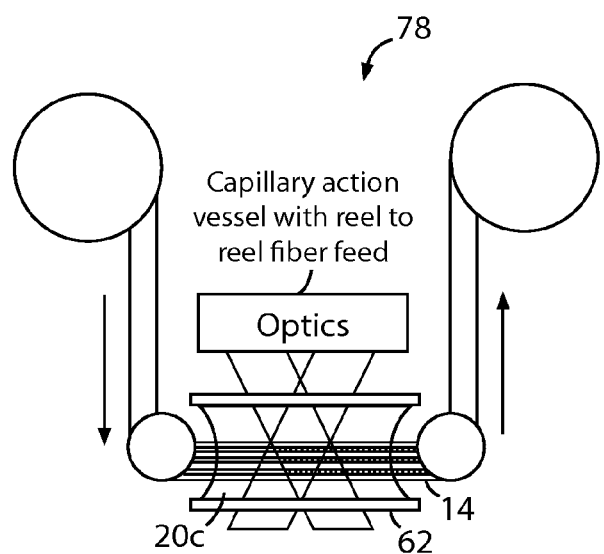
FIG. 7 is a schematic diagram showing another embodiment of a system with index-matching material and a reel to reel fiber feed for making long gratings.

FIG. 7 is a schematic diagram showing another embodiment of an index-matching system, which permits a reel-to-reel fiber-feed system. As discussed with reference to FIGS. 6A and 6B, if the liquid index-matching material 20c is maintained within the vessel 62 via capillary action, then the optical fiber 14 can be directed through the gap using a reel-to-reel fiber-feed system 78. This type of reel-to-reel system permits inscription of multiple gratings as the optical fiber 14 passes through the gap. As one can imagine, the system of FIG. 7 is susceptible to depletion of liquid index-matching material 20c from the vessel 62 if the liquid index-matching material 20c adheres to the optical fiber 14 as the optical fiber 14 passes through the gap. One way to mitigate the depletion of liquid index-matching material 20c is by replenishing the liquid index-matching material 20c, as shown with reference to FIG. 15.

Figure 15:
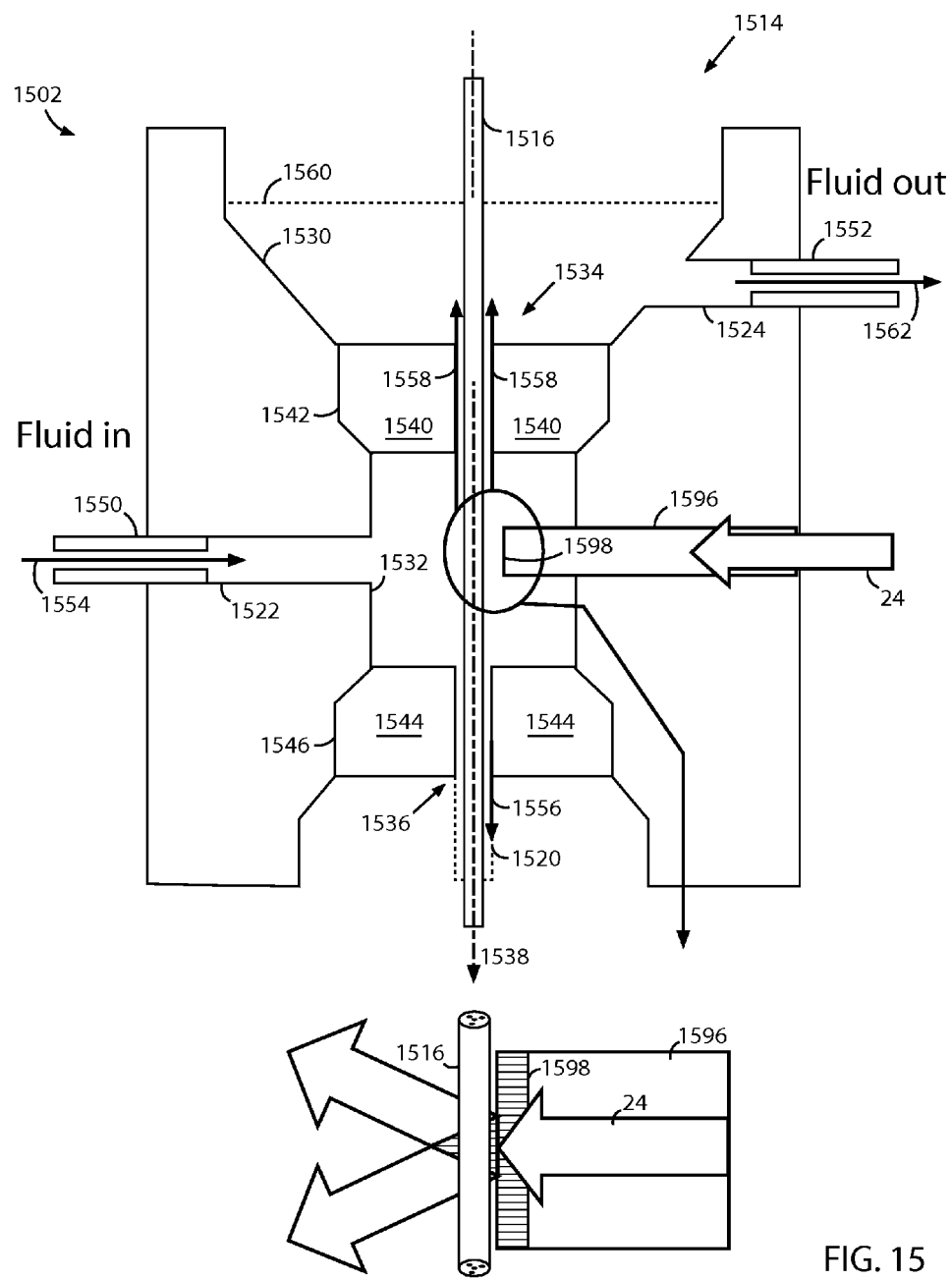
FIG. 15 is a schematic diagram showing another embodiment of a vessel with index-matching material.

FIG. 15 is a schematic diagram showing a cross-section of one embodiment of a vessel 1502 that permits replenishment of liquid index-matching material 1560 as an optical fiber 1516 passes through the vessel 1502. Specifically, the vessel 1502 is similar to a coating vessel by Lindholm in "Systems and methods for coating optical fiber," U.S. Pat. No. 6,958, 096. Thus, one will appreciate that the replenishment system can be implemented on a draw tower, such that the draw tower incorporates the vessel holding the liquid index-matching material. For such embodiments, it should be understood that the liquid index-matching material has at least two properties, namely, being curable to form a coating and being able to match an index of refraction. As shown in FIG. 15, the vessel 1502 comprises an open cup 1530 that is positioned over a chamber 1532. It will be seen that the upper portion of the cup 1530 forms an upper vessel opening 1514. The cup 1530 and chamber 1532 are connected to each other by an entrance aperture 1534. At the bottom of the chamber 1532, opposite the entrance aperture 1534, there is provided an exit aperture 1536.

The cup 1530, entrance aperture 1534, chamber 1532, and exit aperture 1536 together define a liquid pathway 1538 along which a fiber 1516 to be surrounded by the liquid travels into, through, and out of the vessel 1502. As illustrated by arrow 1554, liquid index-matching material 1560 is pumped into the chamber 1532 through the input port 1522. A suitable input fitting 1550, such as a nipple, has been mounted into port 1522. The entrance aperture 1534 is dimensioned so that when a fiber 1516 travels down the liquid pathway 1538, there is sufficient clearance at the entrance aperture 1534 around the fiber 1516 to allow liquid index-matching material 1560 to flow upward into the cup 1530. As illustrated by arrow 1562, excess liquid index-matching material 1560 drains out of the cup 1530 through the drain port 1524. As shown in FIG. 15, a suitable output fitting 1552 is mounted into the output port 1524. The excess liquid index-matching material 1560 may be recirculated for pumping back into the input port 1522.

The entrance aperture 1534 is implemented using an entrance die assembly 1540 that is mounted into a first opening 1542 formed in the vessel 1502 between the cup 1530 and the chamber 1532. The exit aperture 1536 is implemented using a shaping die assembly 1544 that is mounted into a second opening 1546 at the bottom of the chamber 1532 leading to the exterior of the vessel 1502. It should be noted that it would also be possible to form the entrance and exit apertures 1534, 1536 directly into the vessel 1502 without the use of die assemblies 1540, 1544. However, die assemblies 1540, 1544 are useful for a number of reasons. First, they provide flexibility, as they allow different sizes of apertures 1534, 1536 to be used, as desired. In addition, using removable die assemblies provides access to the interior of the vessel 1502, which facilitates cleaning or other maintenance operations.

As illustrated by arrow 1556, a certain amount of liquid index-matching material 1560 flows downward, out through exit aperture 1536, and around fiber 1516, where it forms a liquid 1520. Arrows 1558 illustrate the counter-flow of liquid index-matching material 1560 up through entrance aperture 1534, and around fiber 1516, into cup 1530. The fill level of the cup 1530 may vary, depending upon a number of parameters, including the dimensions of the various elements of the vessel 1502, the viscosity of the liquid index-matching material 1560 used, and the pressure at which the liquid index-matching material 1560 is introduced into the chamber 1532.

To expose the optical fiber 1516 to an actinic beam 24, the vessel 1502 comprises a beam conduit 1596 having a phase mask 1598 at the inward end of the conduit 1596. Thus, as the optical fiber 1516 travels through the vessel 1502, that optical fiber 1516 can be inscribed by the incoming actinic beam 24 from which an interferogram is generated by the phase mask 1598. It should be appreciated that for embodiments with a replenishment system, such as that shown in FIG. 15, the interference pattern can be generated using mechanisms other than a phase mask. For instance, the beam conduit could accommodate two beams travelling with an angle between them and forming an interferogram inside the vessel.

The liquid index-matching material 1560 contained in the chamber 1532 has a predetermined induced pressure above atmospheric pressure. The appropriate pressurization of the chamber 1532 is accomplished by choosing a diameter for the entrance aperture 1534 such that when liquid index-matching material 1560 is pumped into the chamber 1532, there is sufficient resistance to flow at the entrance aperture 1534 to allow a desired hydrostatic pressure to build up within the chamber 1532. It should be noted that, although the liquid index-matching material 1560 contained in the chamber 1532 is pressurized, it has been found that turbulence in the liquid index-matching material 1560 in the cup 1530 does not exceed manageable levels.

It should be noted that a relatively large entrance aperture 1534 may be used, and thus with a relatively small increase in the hydrostatic pressure of the liquid index-matching material 1560 contained in the chamber 1532. A large entrance aperture 1534 may be desirable to allow the fiber 1516 to pass freely through the aperture 1534, to minimize turbulence in the liquid index-matching material 1560 and to avoid any centering issues that may arise in connection with a smaller entrance aperture 1534.

By replenishing the liquid index-matching material 1560 as the optical fiber 1516 passes through the vessel 1502, one can make sure that the optical fiber 1516 is surrounded by the liquid index-matching material 1560 during grating inscription. Furthermore, by using the vessel 1502 of FIG. 15, it may be possible to inscribe gratings as the optical fiber 1516 is being drawn.

We note that a replenishment system similar to that of FIG. 15 may be used in any of the other embodiments of this invention.

Another replenishment system suitable for vessels holding index matching liquid by capillary action employs a syringe or dropper to introduce index matching liquid into the vessel. Excess index matching liquid may exit the vessel by gravity.

Figure 16:
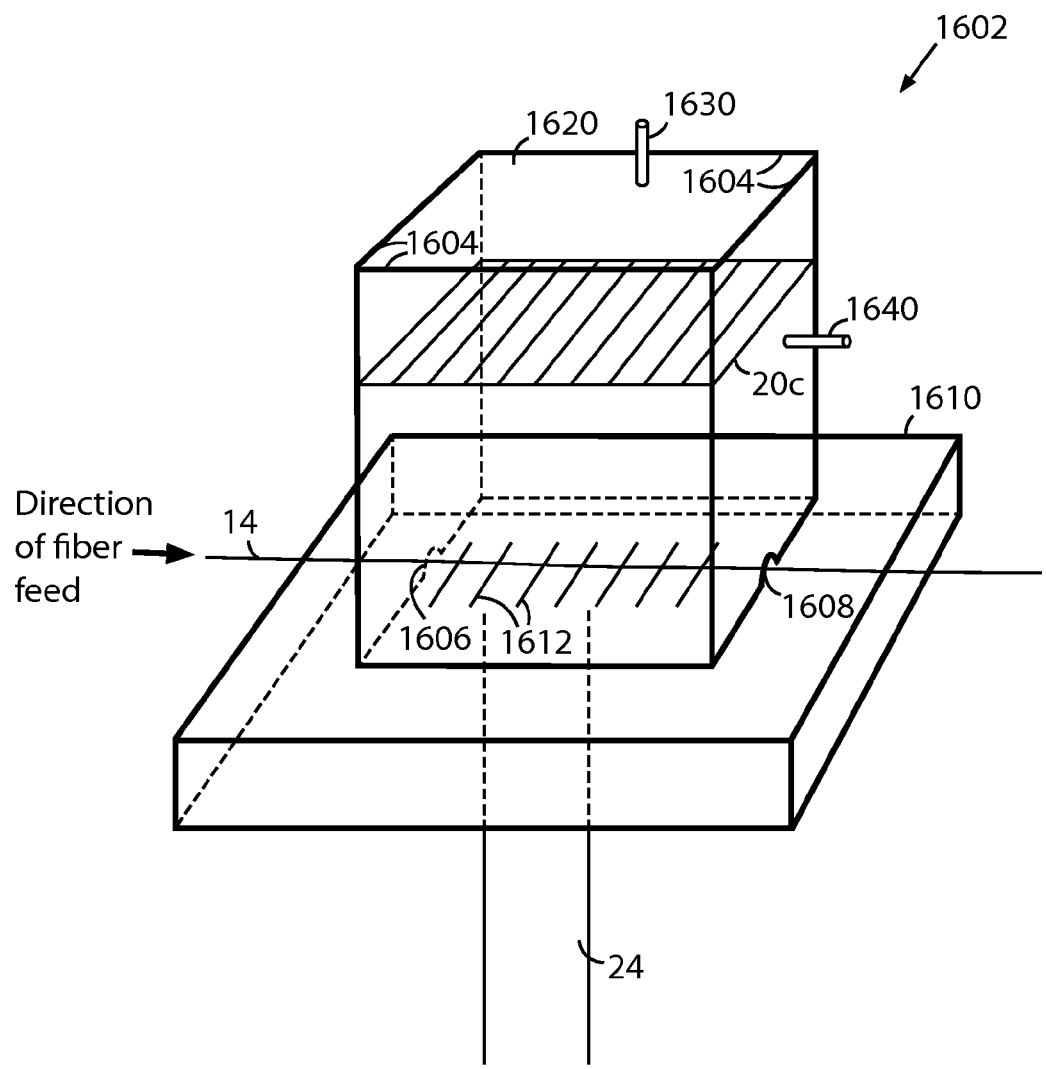
FIG. 16 is a schematic diagram showing yet another embodiment of a vessel with index-matching material.

Another approach to ameliorating the depletion of liquid index-matching material 20c is shown with reference to FIG. 16. Specifically, FIG. 16 comprises an upright vessel 1602 with four side walls 1604 and a bottom 1610, which together form a container for liquid index-matching material 20c. The bottom 1610 comprises phase mask grooves 1612, and the side walls 1604 comprise an entrance hole 1606 and an exit hole 1608 through which an optical fiber 14 passes. In the embodiment of FIG. 16, actinic radiation 24 is introduced through the phase mask grooves 1612 on the bottom 1610. The diffracting beams after the mask are not shown for clarity. The liquid index-matching material 20c can be replenished by simply filling the vessel 1602 when the liquid level drops below a predefined threshold. If the vessel also has a top wall 1620, then the liquid may be held in place by the vacuum force above the liquid. For embodiments with a top wall, one may also devise a mechanism 1630, 1640 to introduce or replenish liquid index-matching material into the vessel. Note that although FIG. 16 shows the phase mask sitting horizontally, it is also possible for the phase mask to sit vertically. As in FIGS. 8 through 10 the groves may face in or out of the vessel and may have a cover slip to maintain their index variation.

Figure 8:
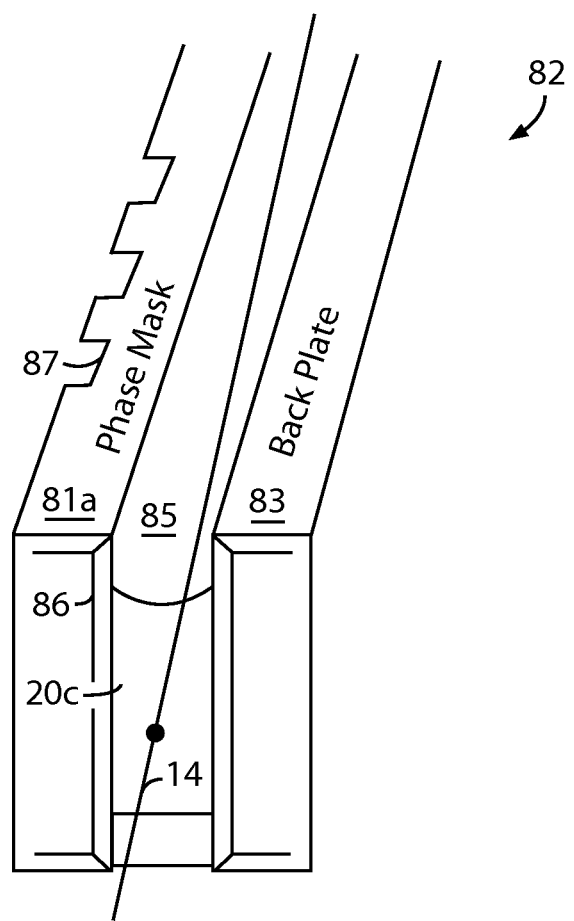
FIG. 8 is a schematic diagram showing one embodiment of an inscription system with index-matching material.

FIG. 8 is a schematic diagram showing one embodiment of a vessel 82 with an integrated phase mask 81a. As shown in FIG. 8, the vessel 82 comprises a back plate 83 and a phase mask 81a, which are separated from each other by a gap 85 that holds liquid index-matching material 20c, preferably by capillary action. In some embodiments, both the phase mask 81a and the back plate 83 have beveled edges 86 that facilitate movement of the optical fiber 14 within the gap 85 without substantial damage to the optical fiber 14 or its coating if one is present. In the embodiment of FIG. 8, the phase mask 81a comprises teeth (or grooves) 87 that face away from the gap 85. Preferably, the phase mask 81a should be thin so that: (a) the teeth 87 on the phase mask 81a are close to the optical fiber 14; (b) there is minimal attenuation or distortion due to the thickness of the phase mask 81a; (c) loss of beam coherence is minimized; and (d) the length of fiber that is exposed by only one rather than both the plus-1 and minus-1 orders of the phase mask is minimized. As such, in some embodiments, the thickness of the phase mask 81a is between approximately 0.1 mm and approximately 5 mm.

Figure 9:
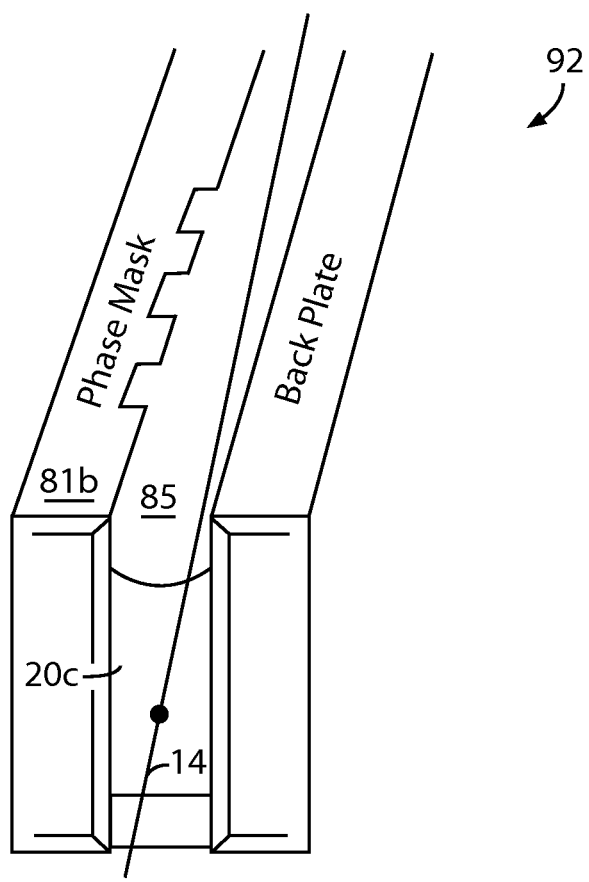
FIG. 9 is a schematic diagram showing another embodiment of an inscription system with index-matching material.

One way of bringing the teeth 87 closer to the optical fiber 14 is by facing the teeth 87 toward the gap 85, as shown in the embodiment of FIG. 9. Specifically, FIG. 9 is a schematic diagram showing an embodiment of a vessel 92 with an integrated phase mask 81b, where the teeth of the phase mask 81b face toward the gap 85 and are in contact with the liquid index-matching material 20c. By facing the teeth toward the gap 85 (FIG. 9), as opposed to away from the gap

85 (FIG. 8), the distance between the teeth and the optical fiber 14 is further reduced. However, one can appreciate that in order for the configuration of FIG. 9 to function properly, there should be an index difference between the phase mask 81*b* and the liquid index-matching material 20*c*.

Figure 10:
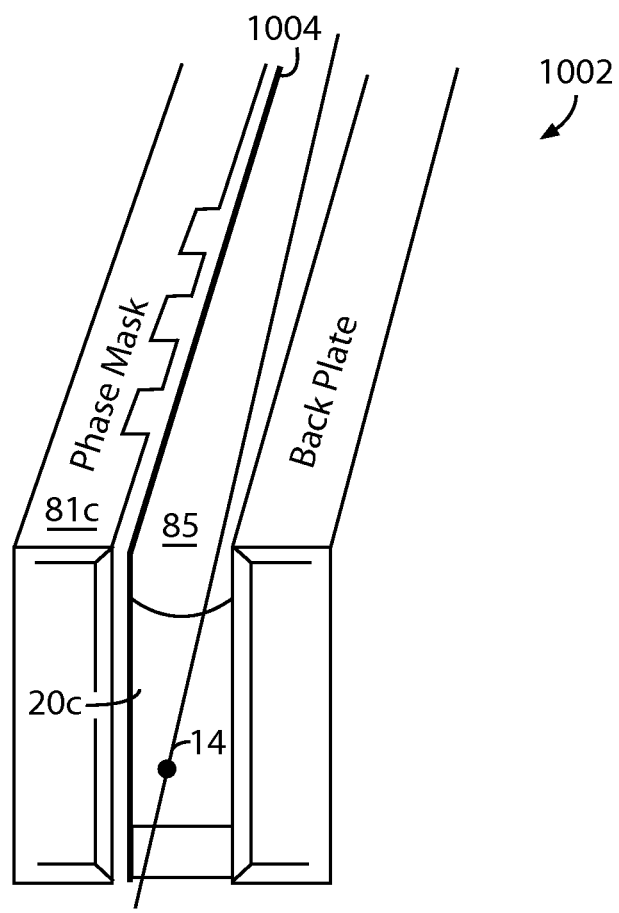
FIG. 10 is a schematic diagram showing yet another embodiment of an inscription system with index-matching material.

FIG. 10 shows a schematic diagram with an embodiment of a vessel 1002 with an integrated phase mask 81*c*, where the teeth of the phase mask 81*c* face toward the gap 85, but where the teeth are isolated from the liquid index-matching material 20*c* by a thin UV-transparent cover plate 1004. As shown in FIG. 10, the liquid index-matching material 20*c* is situated between the cover plate 1004 and the back plate. The phase mask 81*c* may be slightly offset to prevent accidental leakage of the liquid index-matching material 20*c* into the teeth of the phase mask 81*c*. Additionally, for some embodiments, an antireflective coating may be applied to the cover plate 1004. Moreover, the back plate or the front plate (or both) may be angled in such a way to direct back reflections away from the fiber.

Turning to the phase mask itself, it is also possible to bond the cover plate to the phase mask thus sealing the grooves (or teeth) entirely. By sealing the grooves, the sealed phase mask can then be immersed in a liquid index-matching material and still maintain its ability to generate an interferogram because the liquid index-matching material is no longer able to fill the grooves of the phase mask.

In an alternative embodiment, the sealed phase mask can be manufactured by forming cavities or other refractive index modulations beneath the surface of the plate. These cavities or other refractive index modulations can be formed using, e.g., femtosecond IR laser pulses that can penetrate the surface of the plate and affect predefined regions within the plate. Such methods result in the surfaces of the phase plate remaining largely undisturbed while the index non-uniformities (e.g., grooves, voids, or other index variations) of the phase mask are generated below the surface of the phase plate, thereby creating a sealed phase mask. In general, the sealed phase mask will generate an interferogram from an input beam even when placed in a material that has the same refractive index as the outer surface of the sealed phase mask.

FIGS. 11A and 11B are schematic diagrams showing one embodiment of a pulley-based system with index-matching material. Specifically, FIG. 11A shows a side view of a vessel 1102 with actinic radiation 24 entering from the top of the vessel 1102, while FIG. 11B shows a front view of the vessel 1102 with actinic radiation 24 being introduced from the side of the vessel 1102. In the embodiments of FIGS. 11A and 11B, liquid index-matching material 20*c* is held within the vessel 1102, and an optical fiber 14 passes through the vessel 1102 via a pulley system 30*a*, 30*b* (collectively, 30). Note that the purpose of the pulley system is simply to change the direction of the fiber axis so that it may be fed into the vessel. As one skilled in the art will appreciate, different embodiments may employ different numbers of pulleys. For other embodiments, rods or clamps may be used in lieu of pulleys. For the embodiment of FIGS. 11A and 11B, an interferogram-generating mechanism 1150 is located external to the vessel 1102. Thus, as the optical fiber 14 passes through the vessel 1102, an interferogram generated by the actinic radiation 24 inscribes gratings on the fiber.

FIGS. 12A and 12B are schematic diagrams showing another embodiment of a pulley-based system with index-matching material. Unlike the embodiment of FIGS. 11A and 11B, the embodiment of FIGS. 12A and 12B comprise a phase mask 1240 that is integrated into the vessel 1202 by situating the phase mask 1240 within the vessel 1202, thereby bringing the phase mask 1240 closer to the optical fiber 14 that is being inscribed. To the extent that the pulleys 30 are described with reference to FIGS. 11A and 11B, further discussion of the pulley system is omitted here. For embodiments in which the phase mask 1240 is submerged, it is preferable to use a sealed phase mask, as described above. Again, the sealed phase mask may be fabricated by adhering a cover plate above the grooves or, alternatively, by creating the grooves or other index modulations below the surface of a plate.

FIGS. 13A and 13B are schematic diagrams showing yet another embodiment of a pulley-based system with index-matching material. Unlike the embodiments of FIGS. 11A, 11B, 12A, and 12B, the embodiment of FIG. 13A shows a phase mask 1350 that forms a part of the vessel wall. By directly integrating the phase mask 1350 into the vessel 1302, the embodiment of FIG. 13A functions similar to the embodiments of FIGS. 8 through 10. To the extent that the inscription mechanism has been described with reference to FIGS. 8 through 10, and to the extent that the pulley system has been described with reference to FIGS. 11A, 11B, 12A, and 12B, further discussion of those mechanisms is omitted with reference to FIG. 13A.

FIG. 13B shows a side view of the system in FIG. 13A, but with the actinic beam being introduced from the side. As one can appreciate, for the embodiment of FIG. 13B, the phase mask 1350 should be integrated into the side wall, rather than on the top panel.

FIG. 14 is a schematic diagram showing a cross-sectional view of one embodiment of a vessel 1402 with index-matching material 124 situated within a groove 122 in the vessel 1402. By matching the refractive index of the vessel 1402 and the index-matching material 124 to the refractive index of the optical fiber 14, one can judiciously reduce or remove reflection or refraction at the boundary between the optical fiber 14 and the index-matching material 124, and at the boundary between the index-matching material 124 and the vessel 1402.

We also note that while FIGS. 3 through 16 show actinic beams passing through interferometers, it is also possible to pass the actinic beam through an amplitude mask. In such a mask the actinic beam is blocked for certain portions of the mask in order to form a spatial modulation in the beam. This spatial modulation may imprint gratings in the fiber core or cores just as the interferogram from a phase mask may inscribe gratings. For instance if the period of the grating is very long compared to the actinic beam wavelength an amplitude mask may be used to imprint a long period grating in a fiber core. Thus the period of the actinic radiation may be less than one micron, while the period of the long period grating (LPG) may be larger than 100 microns. In such a case an amplitude mask may be more effective for grating inscription, however the methods taught herein for reducing the intensity variations inside the fiber will still be an improvement to previous methods of imprinting LPGs.

It is also possible that a nonuniform or slowly varying exposure is desired in the core or cores of a fiber. Such slowly varying or nonuniform exposures can for instance be used to apodize a Bragg grating or otherwise modify the propagation of light in a given core. In this case as well it will also be useful to reduce the intensity variation across the fiber cross section especially when there is an offset core, a very large core, twisted cores or in general more than one core.

At this point, it is worthwhile to note that the index-matching material should preferably have a refractive index that reduces the distortion of the combined coating and the fiber interfaces by the largest amount. Alternatively, the index-matching material should reduce the overall distortion to something less than the distortion caused by the fiber being surrounded by air. In practice, this means that the rays representing the actinic beam are as close to parallel as possible or, similarly, that the intensity profile of the beam is as uniform as possible throughout the fiber. Thus, the intensity variation (across the cross-section of the fiber) should be less than it would be without the index-matching material. Alternatively, the variation of the intensity contrast of the actinic interferogram should be less than it would be without the index-matching material.

In practice, if the refractive index of a coating is different from the fiber cladding, then one may choose an index-matching material with a refractive index equal to the average of the two refractive indices of the coating and the cladding. Alternatively, one may choose an index-matching material with a refractive index that is equal to the refractive index of the fiber cladding. In yet another alternative, the index-matching material may be chosen to match either the coating or the cladding, depending on which of the two is thicker, or depending on which of the two causes a greater refraction of the actinic beam.

We also note that it is possible for some controlled amount of the liquid index-matching material to remain on the fiber after the vessel. In such a case, and depending on the material selected for the liquid index-matching material, the liquid index-matching material may be further cured into a fiber coating. For such a vessel where the liquid index-matching material slowly depletes from the vessel as it is coated onto the fiber, it would be desirable to replenish the index-matching material within the vessel.

It should also be noted that in several of these embodiments, it may be desirable to provide a process to clean the fiber either before or after the vessel or both. In a case where the fiber leaves the vessel with index-matching material, this material can be cleaned using, for example, a pair (or series) of absorbent pads with solvent. In other embodiments, the optical fiber can be pulled through a vessel of cleaning material (e.g., solvent, etc.), and possibly ultrasonic or thermal treatment, much like the vessel that holds the index-matching material.

Although exemplary embodiments have been shown and described, it will be clear to those of ordinary skill in the art that a number of changes, modifications, or alterations to the disclosure as described may be made. For example, while a phase mask is shown as a particular embodiment of an interferometer, it should be appreciated that other interference-generating mechanisms that can be integrated into the vessel are contemplated within the term interferometer.

Additionally, it should be appreciated that grating inscription can be accomplished by a variety of mechanisms, such as, for example, by using direct write systems, amplitude mask systems, ultra-short-pulse lasers, etc. That is to say, the phase mask appearing in the varying embodiments can be replaced by an amplitude mask. Furthermore, while liquids, such as water, are disclosed for the index-matching material, it should be appreciated that the index-matching material need not be limited to water, or even liquids, and may include gels or other solids. Thus, it should be appreciated that any material can be used for the index-matching material, as long as that material sufficiently reduces refraction at the boundaries of two media. Moreover, the liquid index-matching material may be a material that wets the surface of the fiber, which may be useful for surrounding any defects in the surface of the fiber. Alternatively, the liquid index-matching material may be a material that does not wet the surface at all, thereby allowing the fiber to be pulled through the index-matching material without leaving the index-matching material on the surface of the optical fiber. Additionally, while UV radiation is recited as one form of actinic radiation, it should be appreciated that, depending on the material, actinic radiation can be any type of radiation that causes a change in the material. Thus, depending on the material, actinic radiation can encompass infrared light or even visible light. All such changes, modifications, and alterations should therefore be seen as within the scope of the disclosure.

What is claimed is:

1. A system, comprising:
   a liquid index-matching material having a refractive index that substantially matches a refractive index of an optical fiber;
   a vessel to hold the liquid index-matching material, the vessel comprising a passage for the optical fiber such that the optical fiber is surrounded by the liquid index-matching material; and
   a sealed phase mask formed from a substantially transparent medium having an undisturbed surface, the sealed phase mask optically coupled to the passage, the sealed phase mask to generate an interferogram from incoming actinic radiation, the interferogram to inscribe a grating on the optical fiber, the sealed phase mask comprising index variations formed beneath the undisturbed surface.

2. The system of claim 1, the index variations being grooves.

3. The system of claim 1, the liquid index-matching material being water.

* * * * *